US012688999B2

(12) United States Patent
Ye et al.

(10) Patent No.: US 12,688,999 B2
(45) Date of Patent: Jul. 21, 2026

(54) SYMMETRIC ANTENNA ARRAYS FOR HIGH DENSITY PLASMA ENHANCED PROCESS CHAMBER

(71) Applicant: Applied Materials, Inc., Santa Clara, CA (US)

(72) Inventors: Zheng John Ye, Santa Clara, CA (US); Jeevan Prakash Sequeira, Milpitas, CA (US); Chien-Teh Kao, Sunnyvale, CA (US); Tae Kyung Won, San Jose, CA (US); Young Dong Lee, Hwaseong-Si (KR); Soo Young Choi, Fremont, CA (US); Suhail Anwar, Saratoga, CA (US); Jianhua Zhou, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 835 days.

(21) Appl. No.: 17/941,639

(22) Filed: Sep. 9, 2022

(65) Prior Publication Data

US 2024/0087847 A1      Mar. 14, 2024

(51) Int. Cl.
| | |
|---|---|
| *H01J 37/32* | (2006.01) |
| *C23C 16/505* | (2006.01) |
| *C23C 16/52* | (2006.01) |

(52) U.S. Cl.
CPC ........ *H01J 37/3211* (2013.01); *C23C 16/505* (2013.01); *C23C 16/52* (2013.01); *H01J 37/32119* (2013.01); *H01J 37/32183* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 9,109,754 | B2 * | 8/2015 | Yudovsky | ......... C23C 16/45544 |
| 11,094,508 | B2 * | 8/2021 | Kao | .................. H01J 37/32174 |
| 11,551,909 | B2 * | 1/2023 | Lane | .................. H01J 37/3222 |

(Continued)

FOREIGN PATENT DOCUMENTS

| | | |
|---|---|---|
| EP | 3133635 B1 | 10/2019 |
| JP | 5600644 B2 | 10/2014 |

(Continued)

OTHER PUBLICATIONS

PCT/US2023/031859, International Search Report and Written Opinion dated Dec. 20, 2023, 9 pages.

*Primary Examiner* — Srinivas Sathiraju
(74) *Attorney, Agent, or Firm* — Patterson + Sheridan, LLP

(57) ABSTRACT

The present disclosure is directed to an antenna array. The antenna array includes a plurality of dielectric windows coupled to a support structure comprising a plurality of gas ports, a primary frame comprising a primary conduit connected to a power source and a plurality of secondary frames supported by the primary frame. The secondary frame includes a secondary conduit connected to the primary conduit. A plurality of inductive couplers are disposed over the plurality of dielectric windows and supported by the secondary frames. The plurality of inductive couplers include a plurality of antenna connectors and a plurality of plurality of antennas. The plurality of antenna connectors connect the plurality of antennas to the secondary conduit.

20 Claims, 9 Drawing Sheets

(56)  References Cited

U.S. PATENT DOCUMENTS

| | | | | |
|---|---|---|---|---|
| 11,735,396 | B2 * | 8/2023 | Shim | H01J 37/321 |
| | | | | 315/111.51 |
| 11,854,771 | B2 * | 12/2023 | Kao | C23C 16/505 |
| 12,362,149 | B2 * | 7/2025 | Kao | H01J 37/32174 |
| 2011/0265721 | A1 * | 11/2011 | Kao | H01J 37/3244 |
| | | | | 422/186.04 |
| 2011/0278260 | A1 * | 11/2011 | Lai | H01J 37/32541 |
| | | | | 216/68 |
| 2012/0031560 | A1 * | 2/2012 | Koshimizu | H01J 37/3211 |
| | | | | 118/723 MP |
| 2013/0098477 | A1 * | 4/2013 | Yudovsky | C23C 16/45544 |
| | | | | 137/507 |
| 2015/0200075 | A1 * | 7/2015 | Godyak | H01J 37/32183 |
| | | | | 315/111.51 |
| 2016/0155613 | A1 * | 6/2016 | Yamazawa | H01J 37/3211 |
| | | | | 156/345.48 |
| 2017/0133202 | A1 * | 5/2017 | Berry, III | C23C 16/45565 |
| 2019/0214233 | A1 | 7/2019 | Jo et al. | |
| 2020/0194233 | A1 * | 6/2020 | Kao | H01J 37/321 |
| 2021/0280392 | A1 * | 9/2021 | Kao | H01J 37/321 |
| 2022/0037119 | A1 * | 2/2022 | Dorf | H01J 37/32146 |
| 2023/0162947 | A1 * | 5/2023 | Ye | H01J 37/32541 |
| | | | | 427/579 |
| 2023/0162948 | A1 * | 5/2023 | Shao | H01J 37/32119 |
| | | | | 156/345.48 |
| 2023/0290611 | A1 * | 9/2023 | Benjamin | H01J 37/32119 |
| 2024/0087847 | A1 * | 3/2024 | Ye | H01J 37/3222 |
| 2024/0105427 | A1 * | 3/2024 | Kao | C23C 16/45572 |

FOREIGN PATENT DOCUMENTS

| | | |
|---|---|---|
| KR | 101798373 B1 | 11/2017 |
| WO | 2021126172 A1 | 6/2021 |
| WO | 2021242506 A1 | 12/2021 |

* cited by examiner

POWER SOURCE

454

452

454

202

465

223

130

295B

295A

SYMMETRIC ANTENNA ARRAYS FOR HIGH DENSITY PLASMA ENHANCED PROCESS CHAMBER

BACKGROUND

Field

Embodiments of the present disclosure generally relate to process chambers, such as high-density plasma (HDP) chambers. More particularly, embodiments of the present disclosure relate to symmetric antenna arrays for HDP chambers.

Description of the Related Art

In the manufacture of solar panels or flat panel displays, many processes are employed to deposit thin films on substrates, such as semiconductor substrates, solar panel substrates, and liquid crystal display (LCD) and/or organic light emitting diode (OLED) substrates, to form electronic devices thereon. The deposition is generally accomplished by introducing a precursor gas into a chamber having a substrate disposed on a temperature controlled substrate support. The precursor gas is typically directed through a gas distribution assembly disposed above the substrate support. The precursor gas in the chamber is energized (e.g., excited) into a plasma by applying a single or array of radio frequency (RF) antennas inductively coupled to the precursor gas to form the plasma. The excited gas reacts to form a layer of material on a surface of the substrate that is positioned on the temperature controlled substrate support.

The size of the substrates for forming the electronic devices exceeds 1 square meter in surface area. Uniformity in film thickness across these substrates is difficult to achieve. Film thickness uniformity becomes even more difficult as the substrate sizes increase. To provide uniform thicknesses, gases can be provided to the process region in a plurality of gas distribution zones. Each of the gas distribution zones include plenums that are used to control gas distribution and plasma formation. Uniformity of plasma production, however, continues to be a challenge as substrate sizes continue to increase.

Accordingly, what is needed in the art is a method and apparatus for improved thickness uniformity across large substrates.

SUMMARY

Embodiments of the present disclosure include a method, apparatus, and system distributing plasma.

In some embodiments, an antenna array is disclosed. The antenna array includes a plurality of dielectric windows coupled to a support structure comprising a plurality of gas ports, a primary frame comprising a primary conduit connected to a power source and a plurality of secondary frames supported by the primary frame. The secondary frame includes a secondary conduit connected to the primary conduit. A plurality of inductive couplers are disposed over the plurality of dielectric windows and supported by the secondary frames. The plurality of inductive couplers include a plurality of antenna connectors and a plurality of plurality of antennas. The plurality of antenna connectors connect the plurality of antennas to the secondary conduit.

In some embodiments, a controller of a process system storing instructions is disclosed. The instructions, when executed by a processor, causes the system to process a substrate within a processing chamber by flowing a process gas through a support structure having a gas port into a processing region, forming a plasma using a plurality of inductive couplers, and depositing a film on the substrate. The processing chamber further comprises a plurality of sensors to measure a deposition rate, a power supply, a temperature, and a gas flow rate, calculate a deposition rate on the substrate; and adjust a processing chamber parameter. The process system includes a primary frame comprising a primary conduit connected to a power source, a plurality of secondary frames supported by the primary frame and comprising a secondary conduit connected to the primary conduit, and a plurality of inductive couplers disposed over the plurality of dielectric windows and supported by the secondary frames.

In some embodiments, an antenna array is disclosed. The antenna array includes a plurality of dielectric windows coupled to a support structure comprising a plurality of gas ports. The support structure includes a plurality of openings, a plurality of gas ports and a plurality of gas distribution arms. The gas distribution arms extend from an intersection region of a length and a width of the openings and into the openings. A primary frame includes a primary conduit connected to a power source. A plurality of secondary frames are supported by the primary frame. The secondary frame includes a secondary conduit connected to the primary conduit. A plurality of inductive couplers are disposed over the plurality of dielectric windows and supported by the secondary frames. The plurality of inductive couplers include a plurality of antenna connectors and a plurality of plurality of antennas. The plurality of antenna connectors connect the plurality of antennas to the secondary conduit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to process chambers, such as high-density plasma (HDP) chambers. More particularly, embodiments of the present disclosure relate to symmetric antenna arrays for HDP chambers.

Herein, a support structure is configured to flow gas therethrough and into a processing volume of a chamber in a number of independently controlled zones, in order to improve the uniformity of the processing of the surface of a substrate exposed to the gas in the processing zone. The processing zone is configured to allow processing gas(es) to be flowed thereinto and distributed to result in a relatively uniform flow rate, or in some case tailored flow rate, of the gases into the processing volume. An inductive coupler, such as a radiofrequency (RF) antenna, is positioned proximate to the dielectric window, and the inductive coupler inductively couples energy through the dielectric window to strike and support a plasma in the processing volume. The flow of the process gas(es) in each zone is controlled to result in uniform or tailored gas flows to achieve desired process results on the substrate.

Embodiments of the disclosure include a high density plasma chemical vapor deposition (HDP CVD) processing chamber that is operable form one or more layers or films on a substrate. The processing chamber as disclosed herein is adapted to deliver energized species of a precursor gas that are generated in a plasma. The plasma may be generated by inductively coupling energy into a gas under vacuum. It is to be understood that the embodiments discussed herein may be practiced in other chambers capable of providing high density plasma.

Figure 1:
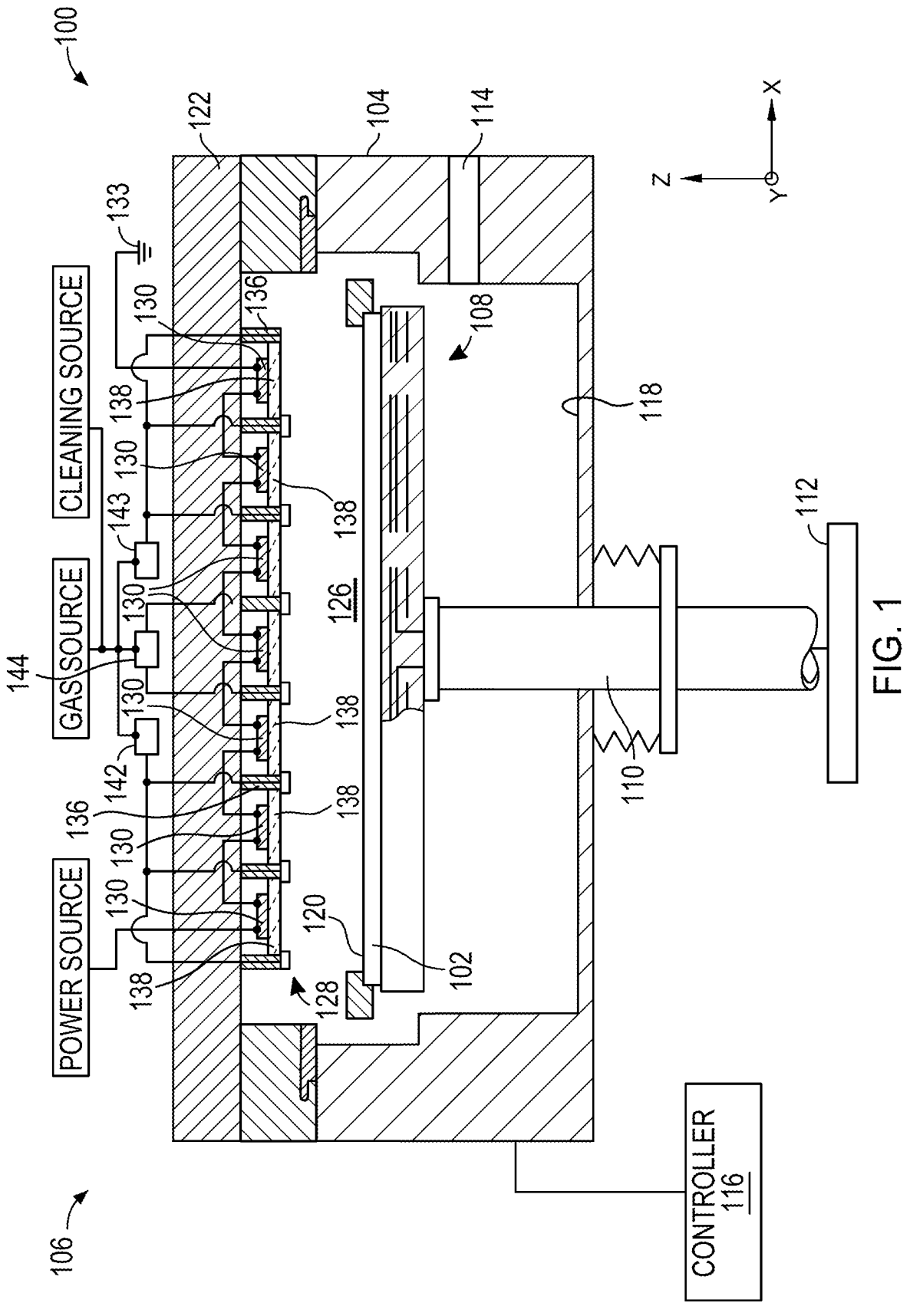
FIG. 1 is a schematic cross-sectional front view of a chamber, according to embodiments of the disclosure.

FIG. 1 is a cross sectional side view showing an illustrative processing chamber 100, according to one embodiment of the present disclosure. A substrate 102 is shown on a substrate surface 120 within a chamber body 104. In one embodiment, the substrate 102 includes a dielectric material (e.g., $SiO_2$, $SiO_xN_y$), a semiconductive material (e.g., silicon or doped silicon), a barrier material ($SiN_x$, $SiO_xN_y$), or a combination thereof. The processing chamber 100 also includes a lid assembly 106, a bottom 118 disposed opposite the lid assembly 106, and a pedestal or substrate support assembly 108 disposed between the lid assembly 106 and the bottom 118. The lid assembly 106 is disposed at an upper end of the chamber body 104, and the substrate support assembly 108 is at least partially disposed within the chamber body 104. The substrate support assembly 108 is coupled to a shaft 110. The shaft 110 is coupled to a drive 112 that moves the substrate support assembly 108 vertically (in the Z direction) within the chamber body 104. The substrate support assembly 108 of the processing chamber 100 shown in FIG. 1 is in a processing position. However, the substrate support assembly 108 may be lowered in the Z direction to a position adjacent to a transfer port 114.

The lid assembly 106 may include a backing plate 122 that rests on the chamber body 104. The lid assembly 106 also functions as a plasma source 128. To function as the plasma source 128, the lid assembly 106 includes one or more inductively coupled plasma generating components, or inductive coupler 130. Each of the one or more inductive couplers 130 may be a single inductive coupler 130, two inductive couplers 130, or more than two inductive couplers 130, are simply described as inductive couplers 130 hereafter. Each of the one or more inductive couplers are coupled across a power source and ground 133. Although FIG. 1 depicts each of the inductive couplers 130 connected to the power source and ground 133 in series, a connection in parallel is also contemplated such that each inductive coupler 130 is connected and controlled independently to the power source and ground 133. In some embodiments, ground 133 is a capacitor. The power source includes a match circuit or a tuning capability for adjusting electrical characteristics of the inductive couplers.

Figure 2:
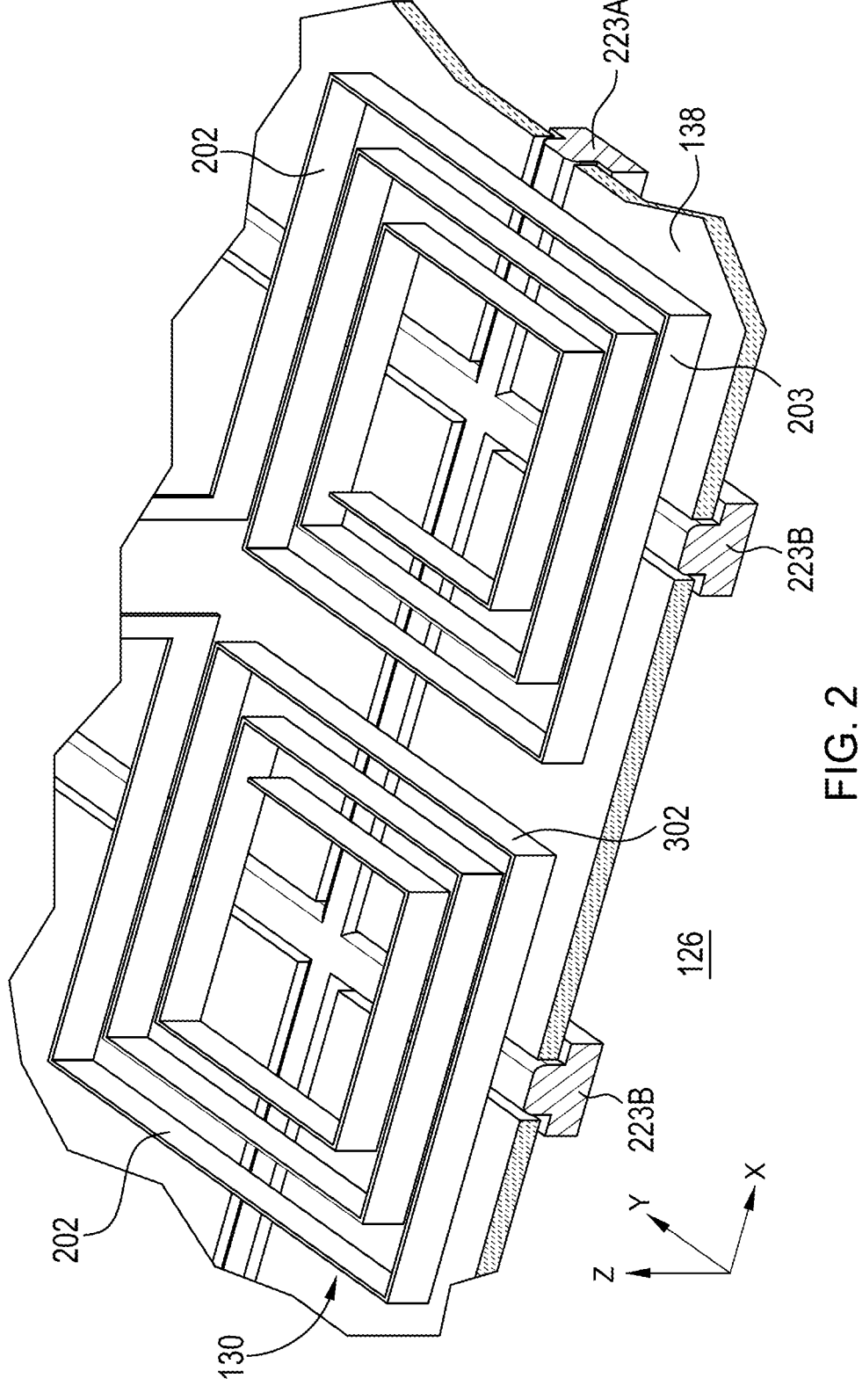
FIG. 2 is an enlarged schematic cross-sectional perspective view of a portion of a lid assembly, according to embodiments of the disclosure.

Each of the dielectric windows 138 are supported by a plurality of support members 136. Each of the one or more inductive couplers or portions of the one or more inductive couplers are positioned on or over a respective dielectric window 138. An inductive coupler 130 that is disposed over the dielectric windows 138 within the lid assembly 106 is shown in FIG. 2. Each of the one or more inductive couplers 130 is configured to create an electromagnetic field that energizes a process gases into a plasma in the processing region 126 as gas is flowing into the processing region 126. In some embodiments, process gases from the gas source are provided to the processing region 126 via conduits in the support members 136. The volume or flow rate of gas(es) entering and leaving the processing region 126 are controlled in different zones of the processing region 126. Zone control of processing gases is provided by a plurality of flow controllers, such as mass flow controllers 142, 143 and 144. For example, the flow rate of gases to peripheral or outer zones of the processing region 126 is controlled by the flow controllers 142, 143, while the flow rate of gases to a central zone of the processing region 126 is controlled by the flow controller 144. When chamber cleaning is required, cleaning gases from a cleaning gas source is flowed to the processing region 126 within which the cleaning gases are energized into ions, radicals, or both. The energized cleaning gases flow into the processing region 126 in order to clean chamber components. In one embodiment, the process gas(es) includes argon (Ar), nitrogen ($N_2$) helium (He), oxygen ($O_2$), carbon dioxide ($CO_2$), hydrogen ($H_2$), ammonia ($NH_3$), phosphine, nitrogen trifluoride ($NF_3$), fluorine ($F_2$), sulfur hexafluoride ($SF_6$), silane ($SiH_4$), tetraethyl orthosilicate (TEOS), water vapor ($H_2O$), or a combination thereof.

The processing chamber 100 further includes a controller 116. The controller 116 is in communication with the processing chamber 100 and is used to control processes of the process chamber 100. The processing chamber 100 includes a plurality of sensors (not shown) disposed therein for measures parameters such as temperature, gas flow, deposition rate, and power.

FIG. 2 is an enlarged cross-sectional perspective view of a portion of the lid assembly 106 of FIG. 1 from a side view of a transfer port 114. The support members 136 further include an interface members 223. The interface member 223 includes gas ports to allow gases to flow into the processing region 126 at predetermined flow rates. Each interface member 223 includes a ledge or shelf that supports a portion of the perimeter or an edge of the dielectric window 138. The interface member 223 may further include gas distribution arms 770, as described in FIG. 7 and FIG. 8.

The reduced lateral surface area of the multiple dielectric windows 138 allows the use of dielectric materials as a physical barrier between the vacuum environment and plasma in the processing region 126 and the atmospheric environment in which the adjacent inductive coupler 130 is typically positioned, without imposing large stresses therein based on a large area supporting the atmospheric pressure load.

In some embodiments, during processing, the processing region 126 has a vacuum pressure of about 10 mTorr to about 3 Torr. Materials for the plasma source 128 are chosen based on one or more of electrical characteristics, strength and chemical stability. The inductive couplers are made of an electrically conductive material. The backing plate 122 and the support members 136 are made of a material that is able to support the weight of the supported components and atmospheric pressure load, which may include a metal or other similar material. The backing plate 122 and the support members 136 can be made of a non-magnetic material (e.g., non-paramagnetic or non-ferromagnetic material), such as an aluminum material. The dielectric windows 138 are made of a quartz, alumina or sapphire materials. In some embodiments, the dielectric windows 138 include copper, silver, aluminum, tungsten, molybdenum, titanium, combinations thereof, or alloys thereof.

Each inductive coupler 130 includes an antenna 202 disposed proximate to one or more corresponding dielectric windows 138 and to a distribution line coupled to a matching network (e.g., power source). In some embodiments, each antenna 202 is disposed over and at least partially surrounds interfaces of adjacent dielectric windows 138. Each antenna 202 is disposed over one or more dielectric windows 138 such that base portions 203, 302 are positioned on the dielectric windows 138. The first and second base portions 203, 302 is made up of first portions 203 oriented at an angle relative to the second portions 302, such as perpendicular to second portion 302 and disposed along an X-axis. The second portions 302 are shown along a Y-axis. Each of the second portions 302 are parallel with respect to one another and each of the first portions 203 are parallel with respect to one another. In the illustrated embodiment, the interface members 223 form a grid to support the portion of the perimeter or the edge of the dielectric window 138. This grid creates a longitudinal interface members 223A and a latitudinal interface members 223B, as shown in FIG. 4. The longitudinal interface member 223A intersects and is perpendicular with the second portions 302 of the antenna 202. The latitudinal members 223B intersects and is perpendicular with the first portions 203 of the antenna 202. Other additional portions are also contemplated to form alternative shapes and angles relative to one another, such as a triangular antenna or a hexagonal antenna. Angles between portions can be about 60 degrees to about 170 degrees, such as about 80 degrees to about 120 degrees, such as about 90 degrees to about 100 degrees.

In some embodiments, the RF power supplied to the inductive coupler 130 is about 1 kW to about 500 kW, such as about 5 kW to about 50 kW, such as about 10 kW to about 30 kW, such as about 15 kW to about 20 kW. In some embodiments, the RF power is supplied at a frequency of about 100 kHz to about 500 MHz frequency depending on the predetermined process and operating parameters. In some embodiments, the RF power is supplied to sustain a plasma having a plasma density of about $1 \times 10^{10}$ cm$^{-3}$ to about $10 \times 10^{12}$ cm$^{-3}$.

Figures 3, 4A:
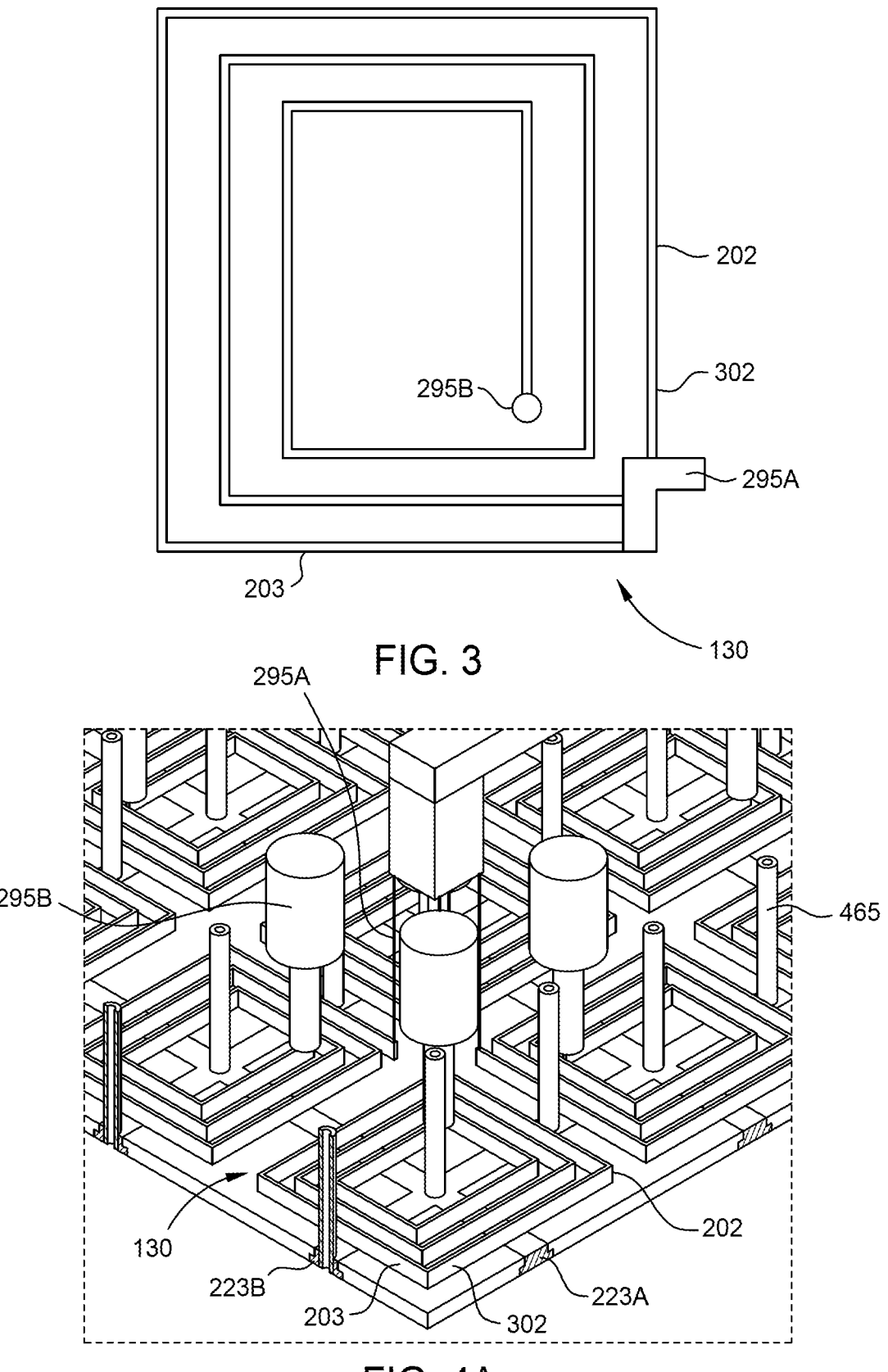
FIG. 3 is a schematic top plan view of an antenna within a lid assembly, according to embodiments of the disclosure.
FIGS. 4A and 4B are schematic perspectives of an antenna array, according to embodiments of the disclosure.
Figures 4A, 4B:
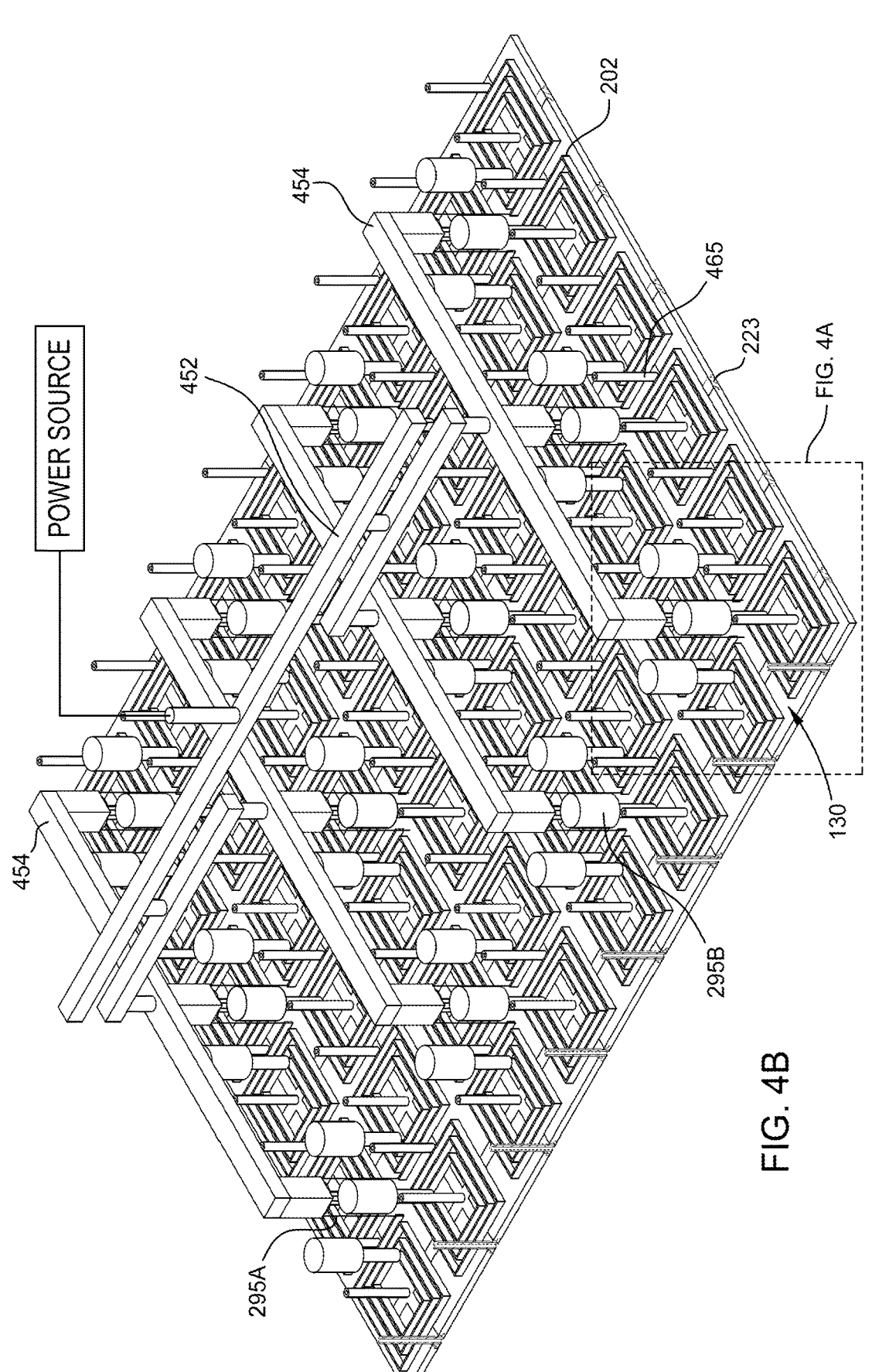

FIG. 3 is a top plan view of an antenna 202 of an inductive coupler 130 positioned on the dielectric windows 138 found in the lid assembly 106. The antenna 202 configuration depicts one antenna 202 that can be arranged with adjacent antennas 202 having substantially the same configuration in a pattern across the lid assembly 106. The antenna 202 includes a conductor pattern that is a rectangular spiral shape. Other spiral shapes are contemplated based on a shape the substrate, such as a triangle or a hexagon. Electrical connections include an electrical input terminal 295A and an electrical output terminal 295B. Each of the one or more inductive couplers 130 of the lid assembly 106 are connected in series and/or in parallel. In some embodiments, the electrode shape is selected based on the shape of the base of the antenna, such as first and second portions 203 and 302. In some embodiments, the electrode shape is a rounded L shaped with portions that are angled relative to the portions 302, such as substantially perpendicular to second portions 302, and with electrode portions that are angled relative to the first portions 203, such as substantially perpendicular to first portions 203.

Figure 5:
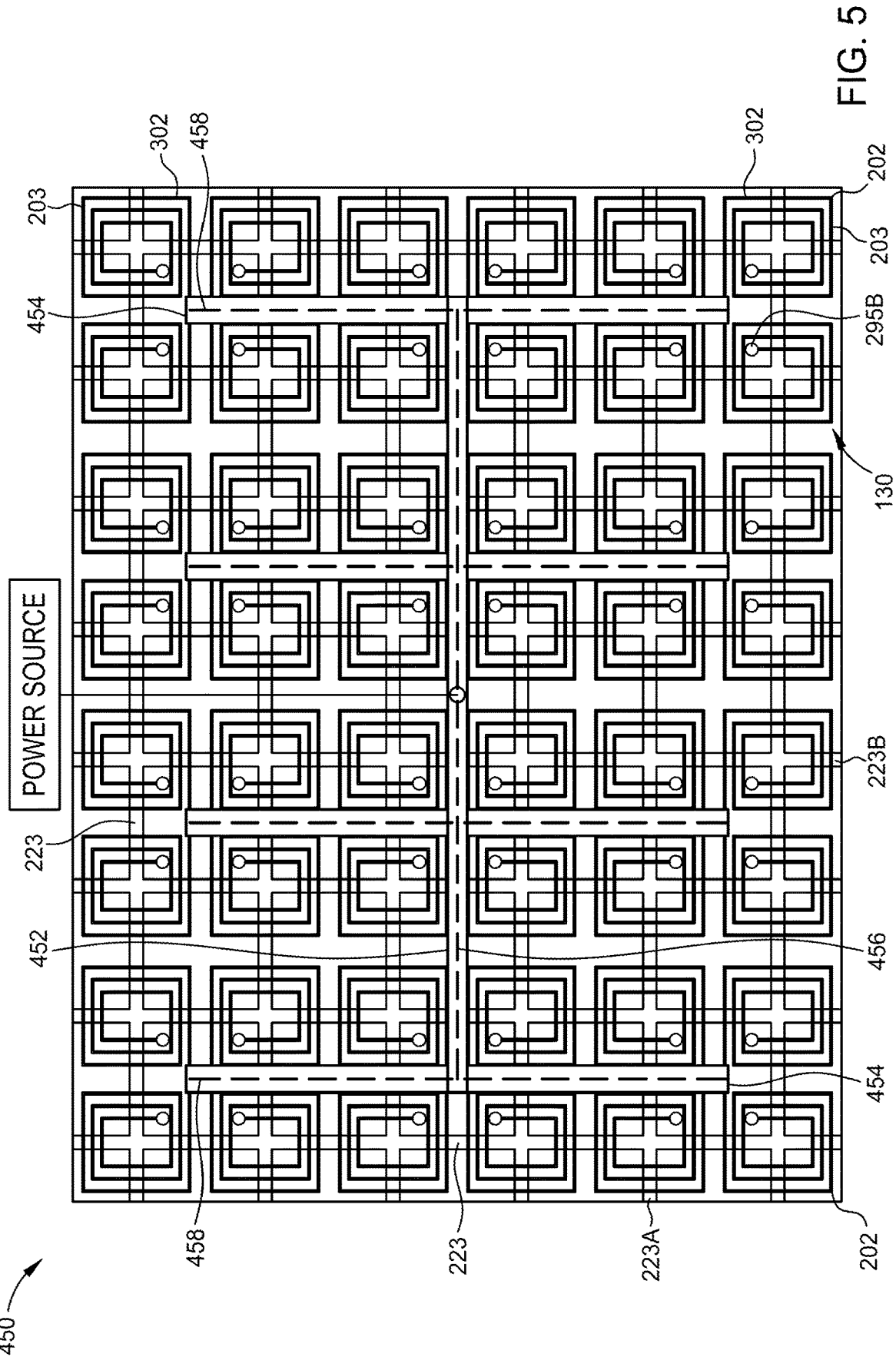
FIG. 5 is a schematic top plan view of an antenna array, according to embodiments of the disclosure.
Figure 6:
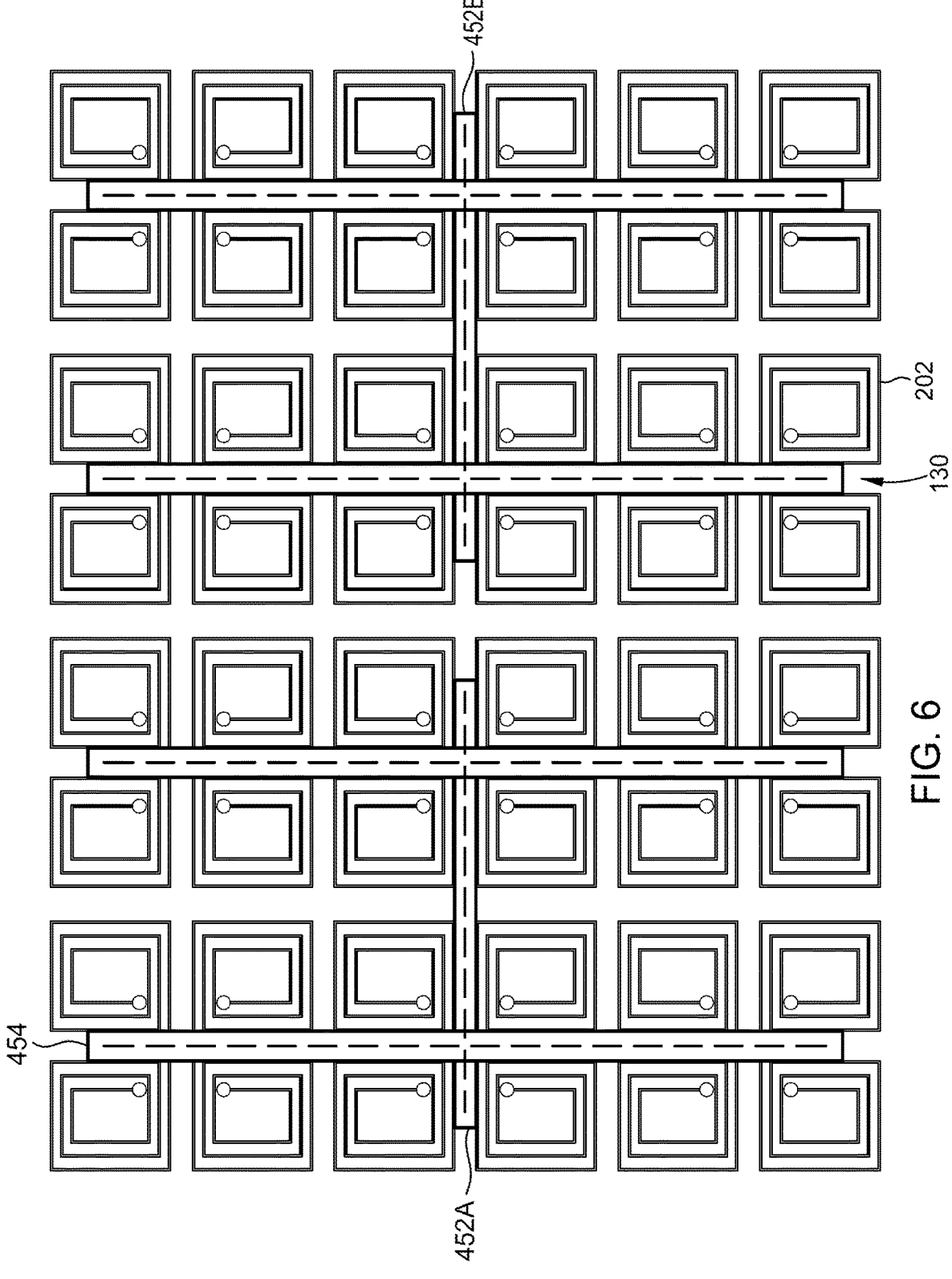
FIG. 6 is a schematic top plan view of an alternative antenna array, according to embodiments of the disclosure.

FIG. 4 is a schematic perspective view of an antenna array 450, according to embodiments. FIG. 5 is a schematic top view of an antenna array 450. The antenna array 450 includes a primary frame 452 and a plurality of secondary frames 454. In the illustrated embodiment, the primary frame 452 supports four secondary frames 454. However, other embodiments of the primary frame 452 can support greater or fewer secondary frames 454. For example, in FIG. 6A, the primary frame 452 supports two secondary frames 454. In FIG. 6B, a first primary frame 452A and second primary frame 452B each support two secondary frames 454. In FIG. 6C, the first primary frame 452A supports a first intermediate frame 455A and a second intermediate frame 455B, each intermediate frame 455A, 455B supporting two secondary frames 454. The secondary frames 454 support a plurality of inductive couplers 130. In one embodiment, the primary frames 452, secondary frames 454, and intermediate frames 455 include a metal material (e.g., stainless steel).

Each primary frame 452 includes a primary conduit 456 and each secondary frame 454 includes a secondary conduit 458. In embodiments that include an intermediate frame 455, the intermediate frames 455 each include an intermediate conduit (not shown). In some embodiments, the intermediate frame 455 may support a plurality of additional intermediate frames 455 in order to connect the primary from 454 to the secondary frame 454. In one embodiment, the primary frames 452, secondary frames 454 are perpendicular to each other. In embodiments where there are intermediate frames 455, the intermediate frame is perpendicular to the primary frame 452 and the secondary frame 454, while the primary frame 452 and secondary frame 454 are parallel to each other.

The primary conduit 456 connects to each secondary conduit 458 to supply RF power to the secondary conduit 458. In embodiments with an intermediate frame 455, the intermediate conduit connects the primary conduit 456 to the secondary conduit 458. Each secondary conduit 458 connects the RF power supply to the inductive couplers 130. The inductive coupler 130 includes a plurality of electrical input terminals 295A and a plurality of the electrical output terminals 295B. In the illustrated embodiment, the inductive coupler 130 includes four antenna connectors 462 to connect to the four antennas 202, creating an antenna sub-array 470.

However, other embodiments may have more or less antenna connectors 462. For example, in an embodiment with a hexagonal antenna, the inductive coupler has six antenna connectors 462 to connect with six antennas 202. The antenna connectors 462 connect the antennas 202 to the secondary conduits 458 to supply RF power to the antenna sub-array 470. In the illustrated embodiments, each secondary frame 454 supports three antenna sub-arrays 470. However, other embodiments may have more or less antenna sub-arrays 470. In one embodiment, the inductive coupler 130 splits the RF power equally between each individual antenna 202 in the antenna sub-array 470, such that path length and power application are approximately equal thus improving process uniformity. In another embodiment, power allocation is individually controlled by a variable load at each antenna 202 such that the power can be substantially different between any two antennas 202. Each of the primary, secondary, and intermediate frames 452, 454, 455 is in either parallel or perpendicular to the flow of the current of the antennas 202 or antenna sub-arrays 470 around the dielectric window 138. Being perpendicular to the flow of current makes the frames 452, 454, 455 transparent or nearly transparent to the inductive current plasma (ICP), thereby minimizing the effect of the frames 452, 454, 455 on the ICP current. The magnetic field produced by the antenna 202 current is least affected by the presence of the metal frames between the antenna and the plasma, whereas if the frames 452, 454, 455 are parallel to the current the magnetic field is substantially attenuated.

The antenna array 450 further includes a plurality of gas conduits 465. The gas conduits 465 allows for the flow of the process gas from the gas source through the support members 136 and interface members 223 to the processing region 126. In the illustrated embodiment, the gas conduits 465 are positioned in the center of each antenna 202 and between the second base portions 302 of adjacent antennas 202. In other embodiments, however, other gas conduit 465 positions are also contemplated.

Figure 7:
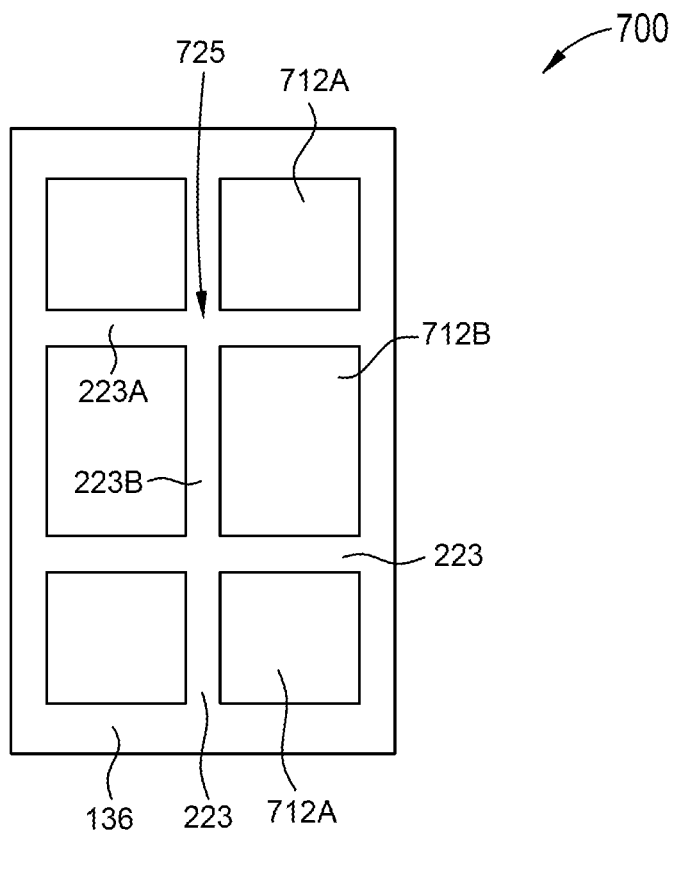
FIG. 7 is a schematic top plan view of a support structure for dielectric windows, according to embodiments of the disclosure.

FIG. 7 depicts a top down view of a support structure 700 for the dielectric window 138. The support structure 700 includes the plurality of support members 136 and interface members 223. The interface members 223, e.g., longitudinal interface member 223A and latitudinal interface member 223B, intersect at an intersection region 725. The support structure 700 includes a plurality of openings 712A, 712B through which the dielectric windows 138 are disposed. End openings 712A are disposed on each end of the support structure 700 and center openings 712B are disposed between two end openings 712A. Although only a single center opening 712B is depicted between two end openings, a plurality of center openings 712B are also contemplated depending on the size of the substrate to be processed. In one embodiment, each of the end openings 712A are shorter in length relative center openings 712B disposed between. Each of the end openings 712A are equal in width relative to the center openings 712B. The width of the end openings 712A and center openings 712B correspond to a length of the longitudinal interface member 233A. The length of the end openings 712A and center openings 712B corresponds to a length of the latitudinal interface members 233B. Although only two rows of end openings 712A, and center openings 712B are shown, other number of rows are contemplated depending on the dimensions and size of the substrate to be processed. In some embodiments, there are about 6 openings (each of 712A, 712B) to about 30 openings, such as about 8 openings to about 20 openings. In some embodiments, each end opening 712A corresponds to a half an antenna and each center opening 512B corresponds to a full antenna, such as two halves of two adjacent antennas disposed thereon or four one-quarter antennas of four adjacent antennas disposed thereon.

With reference back to FIG. 1, the lid assembly 106 having the inductive coupler 130 described herein can be used for HDP process chambers. The antennas 202 of the inductive coupler 130 are capable of controlling a degree of ICP coupling to the plasma at a variety of RF powers. The antennas 202 can be a helix type RF coil of either vertical or flat spiral coils of concentric or rectangular shapes, and of non-flat or vertical shapes, such as a rectangular coil, a hexagonal coil, or a triangular coil. The adjacent coil portions are arranged to locally drive plasma and to interfere or cancel RF magnetic fields generated in order to control constructive or destructive coupling based on coil design. In the illustrated embodiment, the rectangular antenna 202 has 3 turns. However, greater or lesser turns are anticipated.

In the illustrated embodiment of FIG. 5 of the antenna array 450 including rectangular antennas 202, the first base portion 203 and second base portion 302 cross over sections of the support structure 700 at 90 degree angles resulting in current flow that is perpendicular to the support structure 700. This current flow results in little to no change in the magnitude of the magnetic field coupled across the support structure, and thus little to no effect on the plasma produced underneath the components of the support structure 700.

The antenna 202 of the antenna sub-arrays 470 are assembled in a symmetrical fashion, where each of the antennas 202 are a mirror image of the adjacent antenna 202, and each antenna sub-array 470 is a mirror image of the adjacent mirror sub-array 470. Therefore, the currents flowing along an of the first base portion 203 or second base portion 302 of an antenna 202 has a mirror image from the adjacent antenna 202. As a result, all the adjacent antennas 202 and antenna sub-arrays 470 have equivalent currents in both magnitude and direction. Further, the electromagnetic fields produced by the antennas 202 and antenna sub-arrays 470 are enhanced due to constructive (e.g., in-phase) interference, with the highest magnetic field occurring at the interfaces between the antenna sub-arrays 470.

In addition, the antenna array 450 is capable of being scaled up in order to process larger substrates. By using larger substrates, more electronic devices can be manufactured at the same time, leading to more efficient manufacturing processes. Scaling usually requires antenna and RF drive system redesigns comprising new processing chambers. However, as shown in FIGS. 6A-6C, by using the antenna sub-array 470 as the fundamental building block, scaling can be performed with little to no change to the fundamental building block. By adding additional secondary supports 454 supported by additional primary supports 452, the antenna array 450 can be expanded and contracted to suit the application.

Figure 8:
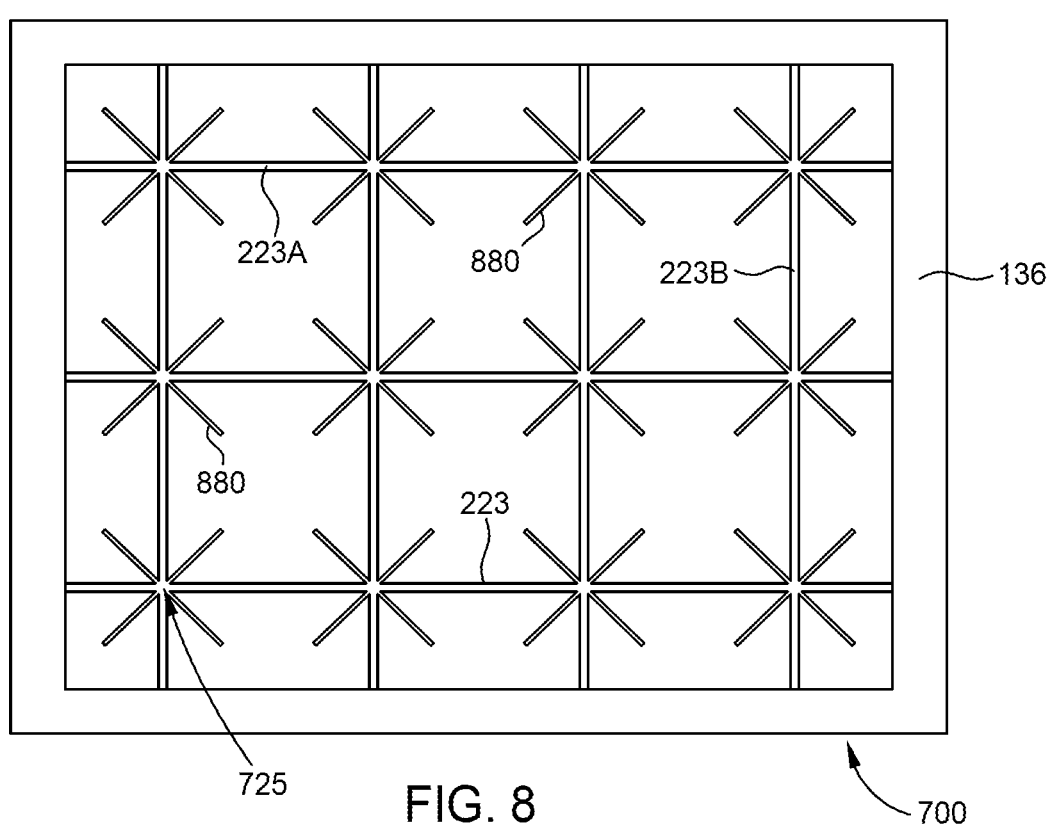
FIG. 8 is a top plan view of a support structure having gas distribution arms, according to embodiments of the disclosure.

FIG. 8 illustrates a schematic bottom view of the support structure 700 including gas distribution arms 880. The gas distribution arms 880 extend from the intersection region 725 of the longitudinal and latitudinal interface members 223A and 223B and towards the center of the dielectric window 138. The gas distribution arm 880 extends from the intersection region 725 at an angle between 1° and 89°, such as between 30° and 65°. In one embodiment, the angle of the gas distribution arm 880 depends on the length and the width of the end openings 712A and center openings 712B (e.g., the length of the latitudinal interface member 223B and the length of the longitudinal interface member 223A, respectively). By tracking the angle to the proportion of the width to the length, the gas distribution arm 880 can remain transparent to the inductive coil plasma (ICP) current. This is because the portion of the gas distribution arm that runs perpendicular to the width or the length will be transparent to the ICP current. Thus, the gas distribution arms will have a minimal effect on the ICP current. In one embodiment, the gas distribution arm includes a metal material (e.g., an aluminum material.)

Figure 9:
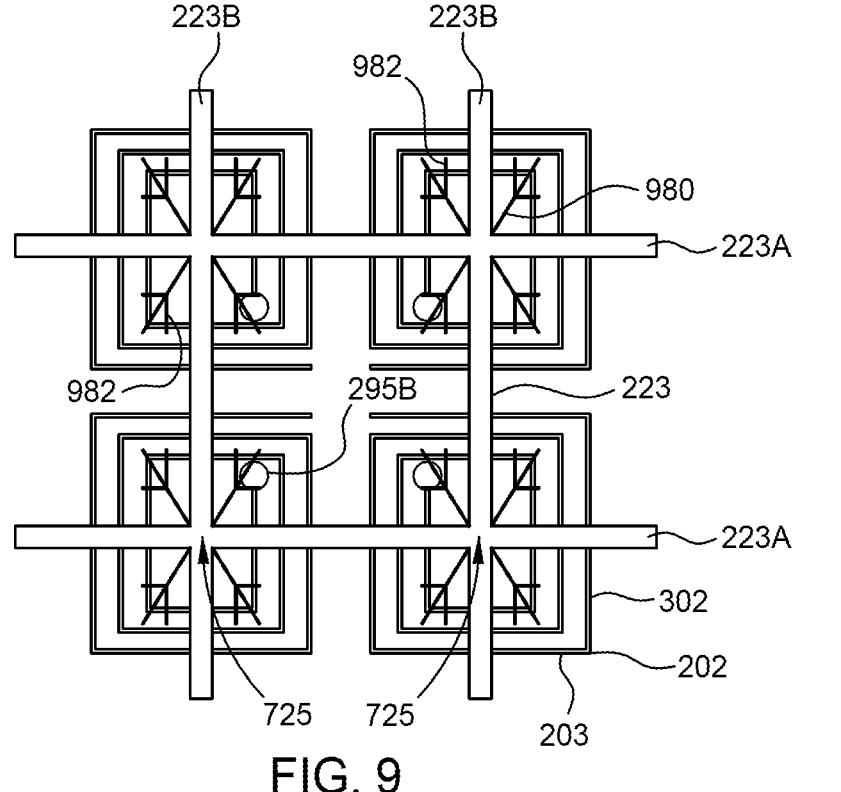
FIG. 9 is a top plan view of a support structure having alternative gas distribution arms, according to embodiments of the disclosure.

FIG. 9 illustrates a schematic bottom view of a portion of the support 700 including gas distribution arms 980. The gas distribution arms 980 extend from the intersection region 725 of the interface members 223 and towards the center of the dielectric window 138. The gas distribution arm 980 extends from the intersection region 725 at an angle between 1° and 89°, such as between 30° and 65°. In one embodiment, the angle of the gas distribution arm 880 depends on the length of the length and the width of the end openings 712A and center openings 712B (e.g., the length of the latitudinal interface member 223B and the length of the longitudinal interface member 223A, respectively). By tracking the angle to the proportion of the width to the length, the gas distribution arm 980 can remain transparent to the inductive coil plasma (ICP) current. This is because the portion of the gas distribution arm that runs perpendicular to the width or the length will be transparent to the ICP current. Thus, the gas distribution arms will have a minimal effect on the ICP current. In one embodiment, the gas distribution arm includes a metal material (e.g., an aluminum material.)

The gas distribution arms 980 further includes gas distribution branches 982. The gas distribution branches diverge from the gas distribution arm 980. A first gas distribution branch 982A diverges parallel to the length of the dielectric window 138 and perpendicular to the width of the dielectric window 138. A second gas distribution branch 982B diverges parallel to the width of the dielectric window 138 and perpendicular to the length of the dielectric window 138. The first gas distribution branch 982 is transparent to the current along the width of the dielectric window 138, while the second gas distribution branch 982B is transparent to the current along the length of the dielectric window 138. As with the gas distribution arms 880, this orientation of the gas distribution branches 982 makes the gas distribution branches 982 transparent to the ICP current. Thus, the gas distribution arm 980 with the gas distribution branches 982 will have minimal effect on the ICP current.

Figure 10:
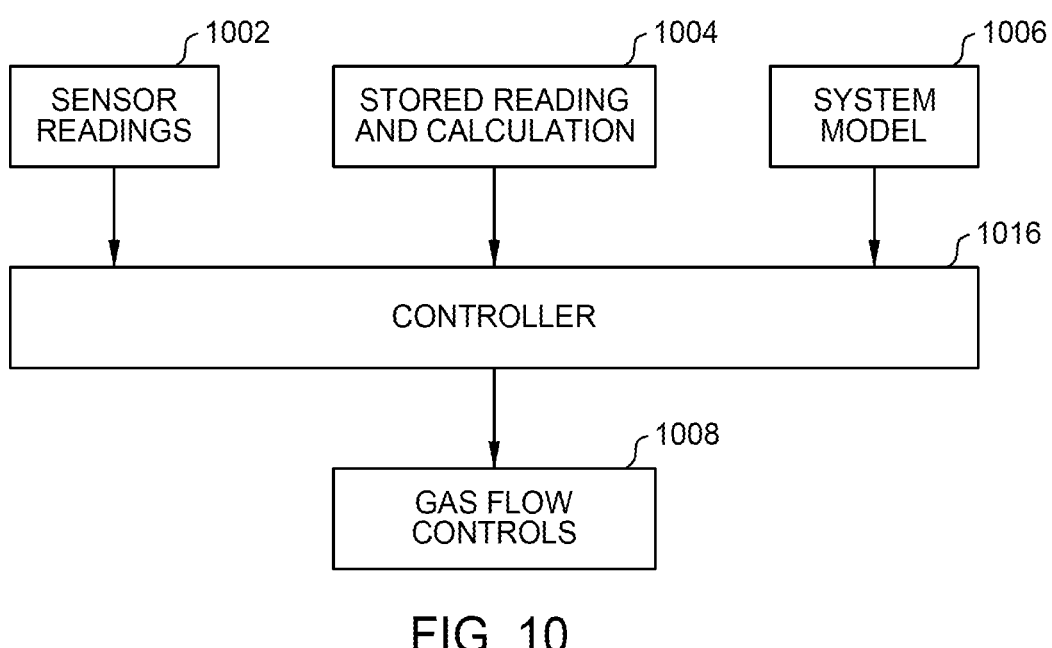
FIG. 10 a control schematic for use within the chamber of FIG. 1, according to embodiments of the disclosure.

FIG. 10 illustrates a control schematic 1000 for use within the processing chamber 100. The controller is part of a process system for storing instructions that, when executed, cause the process system to process a substrate within a processing chamber according to this disclosure. In one embodiment, the instructions cause the process system to process a substrate within a processing chamber by flowing a process gas through a support structure having a gas port into a processing region, forming a plasma using a plurality of inductive couplers, and depositing the gas on the substrate. The processing chamber includes a plurality of sensors to facilitate deposition on the substrate, measure the deposition rate, and control a power supply, a temperature, and a gas flow rate. The controller 116 receives data or input from sensor readings 1002 from the sensors within the processing chamber 100. The controller 116 is equipped with or in communication with a system model 1006 of the processing chamber 100. The system model 1006 includes heating modules, gas flow modules, power modules, and deposition modules. The system model 1006 is a program configured to estimate or determined the gas flow, heating, deposition, and power within the processing chamber 100 throughout the process. The controller 116 is further configured to store readings and calculations 1004.

The readings and calculations 1004 include previous sensor readings 1002 as well as any other previous sensor readings within the processing chamber 100. The readings and calculations 1004 further include the stored calculated values from after the sensor readings 1002 are measured by the controller 116 and run through the system model 1006. Therefore, the controller 116 is configured to both retrieve stored readings and calculations 904 as well as save readings and calculations 1004 for future use. Maintaining previous readings and calculations enables the controller 116 to adjust the system model 1006 over time to reflect a more accurate version of the processing chamber 100.

In embodiments described herein, the controller 116 includes a programmable central processing unit (CPU) that is operated with a memory and a mass storage device, an input control unit, and a display unit (not shown). The controller 116 monitors the precursor, process gas, and purge gas flow. Support circuits are coupled to the CPU for supporting the processor in a conventional manner. In some embodiments, the controller 116 includes multiple controllers 116, such that the stored readings and calculations 1004 and the system model 1006 are stored within a separate controller from the controller 116 which operations the processing chamber 100. In other embodiments, all of the system model 1006 and the stored readings and calculations 1004 are saved within the controller 116.

The controller 116 is configured to control the heating, power, deposition, and gas flow through the processing chamber 100 by controlling aspects of the gas flow controls 1008. The gas flow controls 1008 the process gas source, the purge gas source, and the exhaust pump. The controller 116 may also control the shaft 110 within the processing chamber 100.

The controller 116 is configured to adjust the output to each of the gas flow controls 1008 based off the sensor readings 1002, the system model 1006, and the stored readings and calculations 1004. The controller 116 includes embedded software and a compensation algorithm to calibrate deposition on the substrate 102. The deposition on the substrate 102 may be measured as the substrate leaves the processing chamber or between process operations to provide a reference for deposition rates measured using the sensors. The controller 116 may include a machine-learning algorithm and may use a regression or clustering technique. The algorithm is an unsupervised or a supervised algorithm.

Figure 11:
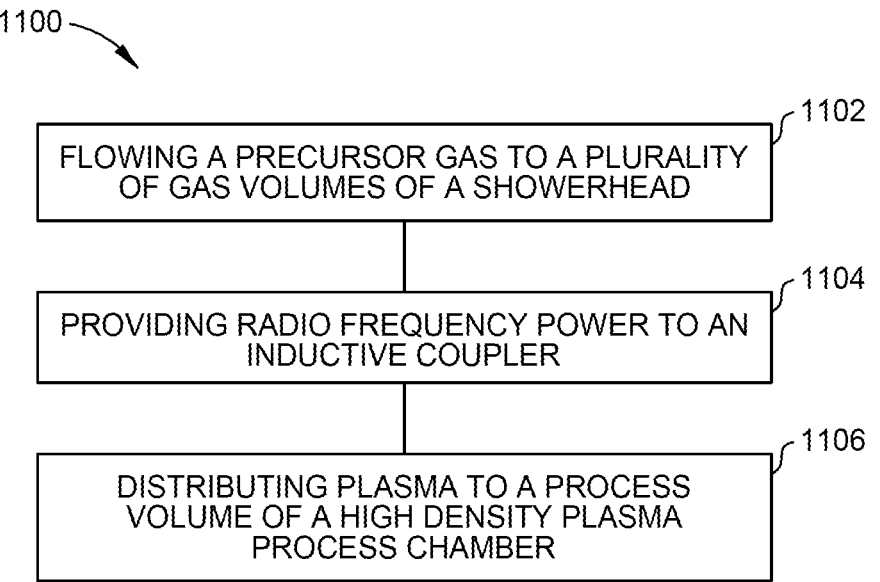
FIG. 11 is a block flow diagram of a method of depositing films over a substrate, according to embodiments of the disclosure.

FIG. 11 is a block flow diagram of a method 1100 of depositing films over a substrate according to an embodiment. The method includes, in operation 1102, flowing a precursor gas to a processing region 126. In operation 1104, a radiofrequency power is provided to an inductive coupler disposed above the processing region 126. In operation 1106, plasma is distributed to a process region 126 of a high-density plasma process chamber 100. The plasma has a plasma density of about $1 \times 10^{10}$ cm$^{-3}$ to about $10 \times 10^{12}$ cm$^{-3}$ and each gas volume is maintained at a vacuum volume of about 10 mTorr to about 3 Torr. A film is deposited on a substrate, such as a rectangular substrate, the film is composed of silicon oxide, silicon nitride, silicon-oxide-nitride, or combinations thereof.

While the foregoing is directed to embodiments of the present disclosure, other and further embodiments of the disclosure may be devised without departing from the basic scope thereof, and the scope thereof is determined by the claims that follow.

11

What is claimed is:

1. An antenna array, comprising:
a plurality of dielectric windows;
a support structure supporting the dielectric windows and comprising a plurality of gas ports;
a primary frame comprising a primary conduit configured to be electrically coupled to a power source;
a plurality of secondary frames supported by the primary frame and comprising a secondary conduit configured to be electrically coupled to the primary conduit; and
a plurality of inductive couplers disposed over the plurality of dielectric windows and supported by the secondary frames, the plurality of inductive couplers comprising:
an antenna sub-array comprising: a plurality of antennas; and
a plurality of antenna connectors, wherein the plurality of antenna connectors electrically couple the plurality of antennas to the secondary conduit, wherein the plurality of inductive couplers are configured to be electrically coupled to the secondary conduit and configured to distribute a RF power from the power source between the plurality of antennas within each antenna sub-array.

2. The antenna array of claim 1, wherein the primary frame and the plurality of secondary frames comprise a metal material.

3. The antenna array of claim 1, wherein the plurality of antennas include a plurality of coils forming a rectangular coil, a triangular coil, or a hexagonal coil.

4. The antenna array of claim 1, wherein the plurality of antennas are disposed over one or more dielectric windows of the plurality of dielectric windows.

5. The antenna array of claim 1, wherein the support structure comprises a plurality of end openings and a plurality of center openings, wherein each of the end openings has two partial antennas disposed over the end openings.

6. The antenna array of claim 5, wherein the full antenna corresponding to each center opening has four partial antennas disposed over the center openings.

7. The antenna array of claim 5, wherein the support structure further includes a plurality of gas distribution arms, the gas distribution arms extending from an intersection region at a length and a width of the center openings into the center openings or a length and a width of the end openings into the end openings.

8. The antenna array of claim 5, wherein the dielectric windows include a length and a width and the primary frame is perpendicular to the length of the dielectric windows and the secondary frames is parallel to the length of the end openings and center openings.

9. A controller of a process system storing instructions that, when executed by a processor, causes the system to:
process a substrate within a processing chamber by flowing a process gas through a support structure supporting the dielectric windows and having a gas port into a processing region, forming a plasma using a plurality of inductive couplers, and depositing a film on the substrate, wherein the processing chamber further comprises a plurality of sensors to:
measure a deposition rate, a power supply, a temperature, and a gas flow rate;
calculate a deposition rate on the substrate; and
adjust a processing chamber parameter; and
wherein process system includes a primary frame comprising a primary conduit configured to be electrically coupled to a power source;

a plurality of secondary frames supported by the primary frame and comprising a secondary conduit configured to be electrically coupled to the primary conduit; and
a plurality of inductive couplers disposed over the plurality of dielectric windows and supported by the secondary frames, the plurality of inductive couplers comprising:
an antenna sub-array comprising:
a plurality of antenna; and
a plurality of antenna connectors, wherein the plurality of antenna connectors electrically couple the plurality of antennas to the secondary conduit, wherein the plurality of inductive couplers are configured to be electrically coupled oth secondary conduit and configured to distribute a RF power from the power source between the plurality of antennas within each antenna sub-array.

10. The controller of claim 9, wherein the process system further comprises:
a plurality of dielectric windows coupled to a support structure comprising a plurality of gas ports.

11. The controller of claim 10, wherein the plurality of antennas include a plurality of coils including one or more of a rectangular coil, a triangular coil, or a hexagonal coil.

12. The controller of claim 11, wherein the support structure comprises a plurality of end openings and a plurality of center openings, wherein each of the end openings corresponds to a half of an antenna and each center opening corresponds to a full antenna.

13. The controller of claim 12, wherein the support structure further includes a plurality of gas distribution arms, the gas distribution arms extending from an intersection region at a length and a width of the center openings into the center openings or a length and a width of the end openings into the end openings.

14. The controller of claim 13, wherein the gas distribution arms include a first gas distribution branch that is parallel to a length of the end openings and center openings and a second gas distribution branch is parallel to a width of the end openings and center openings.

15. The controller of claim 12, wherein the dielectric windows include a length and a width and the primary frame is perpendicular to the length of the dielectric windows and the secondary frames is parallel to the length of the end openings and center openings.

16. An antenna array, comprises:
a plurality of dielectric windows
a support structure supporting the dielectric windows and comprising a plurality of gas ports, wherein the support structure includes a plurality of openings, a plurality of gas ports and a plurality of gas distribution arms, the gas distribution arms extending from an intersection region of a length and a width of the openings and into the openings;
a primary frame comprising a primary conduit configured to be electrically coupled to a power source;
a plurality of secondary frames supported by the primary frame and comprising a secondary conduit configured to be electrically coupled to the primary conduit; and
a plurality of inductive couplers disposed over the plurality of dielectric windows and supported by the secondary frames, the plurality of inductive couplers comprising:
a plurality of antenna connectors and a plurality of plurality of antennas, wherein the plurality of antenna connectors electrically couple the plurality of antennas to the secondary conduit, wherein the plurality of inductive couplers are configured to be electrically coupled to the secondary conduit and configured to distribute a RF power from the power source between the plurality of antennas within each antenna sub-array.

17. The antenna array of claim 16, wherein the gas distribution arms are angled between 30° to 65° from a length of the openings.

18. The antenna array of claim 16, wherein the gas distribution arms further include a plurality of gas distribution branches extending away from the gas distribution arms.

19. The antenna array of claim 18, wherein the gas distribution arms include a first gas distribution branch that is parallel to a length of the openings and a second gas distribution branch is parallel to a width of the openings.

20. The antenna array of claim 16, wherein the primary frame and the plurality of secondary frames comprise a metal material.

* * * * *